US010164524B1

(12) United States Patent
Kumar et al.

(10) Patent No.: US 10,164,524 B1
(45) Date of Patent: Dec. 25, 2018

(54) METHODS AND DEVICES FOR CHARGE PUMP LEVEL TRANSLATION IN HIGH-SPEED MEMORY DRIVERS

(71) Applicant: Cadence Design Systems, Inc., San Jose, CA (US)

(72) Inventors: Vinod Kumar, Pratapgarh (IN); Tara Vishin, Patparganj (IN)

(73) Assignee: Cadence Design Systems, Inc., San Jose, CA (US)

( * ) Notice: Subject to any disclaimer, the term of this patent is extended or adjusted under 35 U.S.C. 154(b) by 212 days.

(21) Appl. No.: 15/169,505

(22) Filed: May 31, 2016

(51) Int. Cl.
*H02M 3/155* (2006.01)
*G11C 7/20* (2006.01)
*G06F 1/32* (2006.01)
*G11C 11/4074* (2006.01)

(52) U.S. Cl.
CPC .......... *H02M 3/155* (2013.01); *G06F 1/3287* (2013.01); *G06F 1/3296* (2013.01); *G11C 7/20* (2013.01); *G11C 11/4074* (2013.01)

(58) Field of Classification Search
CPC ..... G11C 7/20; G11C 11/4074; G06F 1/3287; G06F 1/3296
See application file for complete search history.

(56) References Cited

U.S. PATENT DOCUMENTS

| 7,994,821 B1* | 8/2011 | Wang | H03K 3/356069 326/68 |
| 2004/0164766 A1* | 8/2004 | Yu | H03K 3/356113 326/68 |
| 2014/0232710 A1* | 8/2014 | Low | G09G 3/3696 345/211 |

\* cited by examiner

*Primary Examiner* — Ajay Ojha
(74) *Attorney, Agent, or Firm* — Schwegman Lundberg & Woessner, P.A.

(57) ABSTRACT

Embodiments relate to circuits, electronic design assistance (EDA) circuit layouts, systems, methods, and computer readable media to enable logic devices operating on a core supply voltage to drive memory devices operating on different supply voltages. In one embodiment, a programmable level translator device is implemented using an NMOS transistor pair and a PMOS cross quad. The switching characteristics are modified with the use of a charge pump connected to the gate terminals of two of the PMOS transistors within the PMOS cross quad. Transmission gates are also employed to engage and disengage the charge pump based on a control switch. In various embodiments, the level translator device works with a number of memory devices operating over a wide range of power supply voltages.

19 Claims, 12 Drawing Sheets

METHODS AND DEVICES FOR CHARGE PUMP LEVEL TRANSLATION IN HIGH-SPEED MEMORY DRIVERS

TECHNICAL FIELD

Embodiments described herein relate to charge pump circuitry and to associated systems, methods, devices, and instructions for generating electronic design automation (EDA) circuit design files. Some embodiments pertain to microprocessor interface circuits with memory devices, for example double data rate (DDR) synchronous dynamic random access memory (SDRAM) such as DDR2, DDR3, and DDR4, and low power double data rate (LPDDR) SDRAM, used in portable electronic devices. Some embodiments particularly relate to driving these memory devices from microprocessors with a low core voltage.

BACKGROUND

A typical computing machine is implemented with a microprocessor, memory, and a number of other modules depending on the function to be performed by the computing machine. Double data rate (DDR) random access memory (RAM) is a particular type of RAM commonly used in current technology that performs two read accesses or two write accesses per clock cycle. Both microprocessors and DDR RAM operate on various different power supply voltages. Programmable interface circuits can be used to allow for compatible communication between different microprocessors and DDR RAM chips.

Electronic design automation (EDA) is a category of systems for assisting with the design of electronic systems and devices. Large, integrated circuit designs are often assembled from previously designed blocks. This enables reduced turnaround times for generation of an integrated circuit. Schematic and layout information for such block portions of a design may be exchanged or licensed as intellectual property.

DETAILED DESCRIPTION

Embodiments described herein relate to electronic design automation (EDA), and to systems, methods, devices, and instructions for generation circuit design files. Some embodiments pertain to microprocessor interface circuits with memory devices, particularly memory devices such as double data rate (DDR) synchronous dynamic random access memory (SDRAM) such as DDR2, DDR3, and DDR4, and low power double data rate (LPDDR) SDRAM, used in portable electronic devices. Some embodiments particularly relate to driving these memory devices from microprocessors with a low core voltage. The following description and the drawings illustrate specific embodiments to enable those skilled in the art to practice them. Other embodiments can incorporate structural, logical, electrical, process, and other changes. Portions and features of some embodiments can be included in, or substituted for, those of other embodiments. Elements of the embodiments described herein are intended to cover all available equivalents of the elements described.

Various embodiments described herein relate to circuits designed in complementary metal oxide semiconductor (CMOS) field effect transistors (FETs). These transistors are favored in digital integrated circuits for their simplicity, low cost, high density, and low power dissipation. Specifically, CMOS transistors dissipate power while dynamically switching and exhibit no static power dissipation. The CMOS transistors are either of an N-type or a P-type, which indicates the doping content of the channel of the transistor. For example, an N-channel CMOS transistor produces an N-channel when the gate voltage exceeds a threshold. The N-type or N-channel transistors will be referred to as N-channel metal oxide semiconductor (NMOS) FETs and the P-type or P-channel transistors may be referred to as P-channel metal oxide semiconductor (PMOS) FETs. Common voltages used to describe these transistors are the gate to source voltage ($V_{gs}$), drain to source voltage ($V_{ds}$), and threshold voltage ($V_t$). The current through the transistors is the drain to source current ($I_{ds}$). For NMOS transistors all these values are usually positive, and for PMOS transistors all these values are usually negative. In this document, the PMOS voltages and current will be described in terms of absolute values. Specifically, when referring to PMOS transistors, the gate to source voltage will mean $|V_{gs}|$, the drain to source voltage will mean $|V_{ds}|$, the threshold voltage will mean $|V_t|$, and the drain current will mean $|I_{ds}|$.

Figure 1:
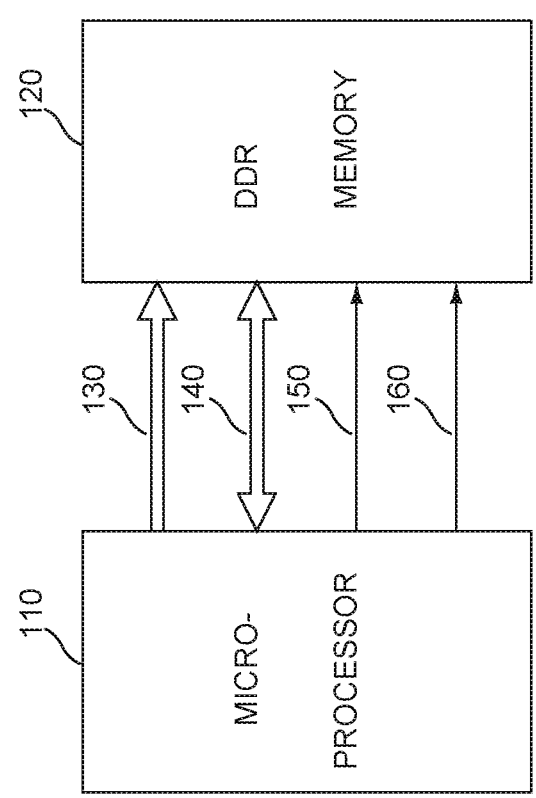
FIG. 1 illustrates an interface between a microprocessor and a memory module, in accordance with some embodiments described herein.

FIG. 1 illustrates the interface between a microprocessor 110 and a memory module 120, in accordance with some embodiments described herein. The memory module 120 is a dynamic random access memory (DRAM) that is connected to the microprocessor 110 by an address bus 130 and a data bus 140 used to communicate signals including at least a read-write (R/W) signal 150, and a chip-enable (CE) signal 160. The system shown in FIG. 1. is simple implementation of a microprocessor system that would be in various ways depending on the application for various embodiments described herein. The memory module 120 is a DDR SDRAM. In other embodiments, other memory circuitry may be used.

Non-volatile memory is memory that retains the stored information even when powered off. Examples of non-volatile memory are hard disks, memory tapes, and flash RAM. Volatile RAM is memory that loses the information when power is disconnected. Examples of volatile ram are static RAM (SRAM) and DRAM. SRAM uses more transistors in a feedback latch up configuration. In various embodiments, this configuration does not require refreshing. DRAM is usually implemented with a small capacitor which will slowly leak charge and consequently needs to be periodically refreshed. SRAM is faster and more expensive and used sparingly in devices such as a high-speed cache. DRAM is one possible method for bulk volatile memory access. DRAM is usually controlled on a system clock and therefore referred to as synchronous dynamic random access memory (SDRAM).

Single Data Rate (SDR) SDRAM was originally built to execute one memory read access or one write access per clock cycle. On each clock cycle an n-bit word may be transferred to or from the memory. The word length is usually in multiples of eight, and in more recent computing machines, it is common to transfer 64-bit words per clock cycle. Double Data Rate (DDR) SDRAM was implemented as an improvement over SDR SDRAM capable of performing two read accesses or two write accesses per clock cycle. This was accomplished by performing one access on the rising edge of the clock and one access on the falling edge of the clock. In this manner, the data transfer rate is doubled by transferring two 64-bit words per clock cycle.

The operation of the microprocessor 110 involves the execution of programs that are loaded into the memory module 120 so as to create, edit, and delete data that is also stored in the memory module 120 or other devices. Specifically, each microprocessor 110 operation involves a fetch and execute cycle where an instruction is read from the memory module 120, decoded by the microprocessor 110, and executed. Also, the execution of the instruction often involves a data read from or a data write to the memory module 120. Each of these instruction cycles is performed synchronously to a system clock, with the duration of the instruction cycle lasting between one and three clock cycles.

A memory access interface involves the data bus 140 with a bus width of n bits to provide the transfer to and from the memory module 120 in the form of n-bit words. The location in the memory module 120 which the data word is being written to or read from is indicated by the address bus 130. The memory module 120 is selected by the CE signal 160, which allows the data bus 140 to be used by other devices not shown in FIG. 1. The R/W signal 150 indicates to the memory module 120 whether the data access is a read operation or a write operation. This also determines the directional operation of the data bus 140. A clock signal is used to synchronize the microprocessor 110 and the memory module 120 during memory access and is not shown in FIG. 1.

During a write operation, the microprocessor 110 indicates the address location on the address bus 130 and places the data on the data bus 140. It also asserts the CE signal 160 and the R/W signal 150 for a write operation. Then the memory module 120 writes the data on the data bus 140 into the memory at the address location indicated by the address bus 130, and the write operation is complete. During a read operation, the microprocessor 110 indicates the address location on the address bus 130 and floats the data bus 140 (high Z or high impedance state). It also asserts the CE signal 160 and the R/W signal 150 for a read operation. Then the memory module 120 places the data at the memory location indicated by the address bus 130 onto the data bus 140. The microprocessor 110 then reads the data from the data bus 140, and the read operation is complete. All these functions are synchronized to the system clock, which is provided to both the microprocessor 110 and the memory module 120. Note that this is a description of a traditional microprocessor with a very simple implementation. Modern implementations are significantly more complicated, involving memory caches, direct memory access transfers, and a plethora of other devices connected to the microprocessor system bus.

The frequency with which the microprocessor 110 accesses memory impacts device performance. Since every instruction cycle involves at least one memory access, the speed of a computing machine can be greatly limited by the memory access speed. Therefore, improving the method and speed of the memory access plays a continuing role in the evolution of computing machines. Various factors impact the interface circuits between the microprocessor 110 and the memory module 120. The controlling interface circuits that are controlling a memory bus may be designed with sufficient drive capability to quickly switch under the loading conditions as presented by the bus lines and the chips connected to them. Additionally, in various systems the signals propagate fast enough along the bus lines that transmission effects become significant. Therefore, the bus lines along with the source and load impedances are controlled so as to reduce reflections. Further still, the memory module 120 and the microprocessor 110 often operate at different power supply voltages. Therefore, coherent communication involves the use of a level translator to provide improved performance.

Memory types such as DDR3, DDR4, LPDDR3, LPDD4, and LPDDx often are configured to operate between a $V_{ddq}$=1.6 Volt supply voltage and a $V_{ddq}$=1.0 Volt supply voltage, while many microprocessor cores operate with a power supply voltage as low as $V_{dd}$=0.65 Volts. Therefore, translator interface circuits are needed that can drive a memory module operating on a higher supply voltage from a microprocessor with a lower core voltage. Translator interface driver circuits that are programmable so that the microprocessor can be used with different types of memory operating on different supply voltages also provide benefits. The microprocessor supply voltage, core supply voltage, or signal supply voltage will be referred to as $V_{dd}$, while the memory supply voltage or input/output (I/O) supply voltage will be referred to as $V_{ddq}$. Additionally, various embodiments described herein include ground indications. It will be apparent that in various other embodiments, other voltage settings may be used in place of a connection to an electrical ground, and the various grounds may be separate or connected in various ways in different embodiments.

Integrated circuit (IC) technologies generally offer different types of transistor devices depending on their intended application. Specifically, there are signal devices and I/O devices. The microprocessor uses signal devices operating on the lower microprocessor core supply voltage for computation and program execution. The microprocessor uses I/O devices that can withstand larger voltage levels and higher power levels to interface with external circuits and chips. The signal devices, such as a signal metal oxide semiconductor field effect transistors (MOSFET), are built for low power consumption and switching speed. A MOSFET transistor may be built with a metal or polysilicon gate material constructed over the channel of the transistor. When the voltage applied to a gate terminal exceeds a certain threshold (threshold voltage $V_t$), a conductive channel forms underneath the gate, allowing current to flow from the source to the drain. A thin oxide layer separates and insulates the gate from the channel. The oxide layer is deliberately designed to be very thin to improve transistor characteristics such as the unity gain frequency and threshold voltage. If the gate to drain or gate to source voltage across the oxide layer exceeds a certain level, the transistor will be damaged. The larger I/O transistors are built with a greater power handling capability and with a thicker oxide layer. This allows the I/O transistor to operate with I/O voltage levels without causing damage to the transistor. Because the signal transistors consume less power, occupy less chip area, and switch faster, it is desirable to use them when possible.

Figure 2:
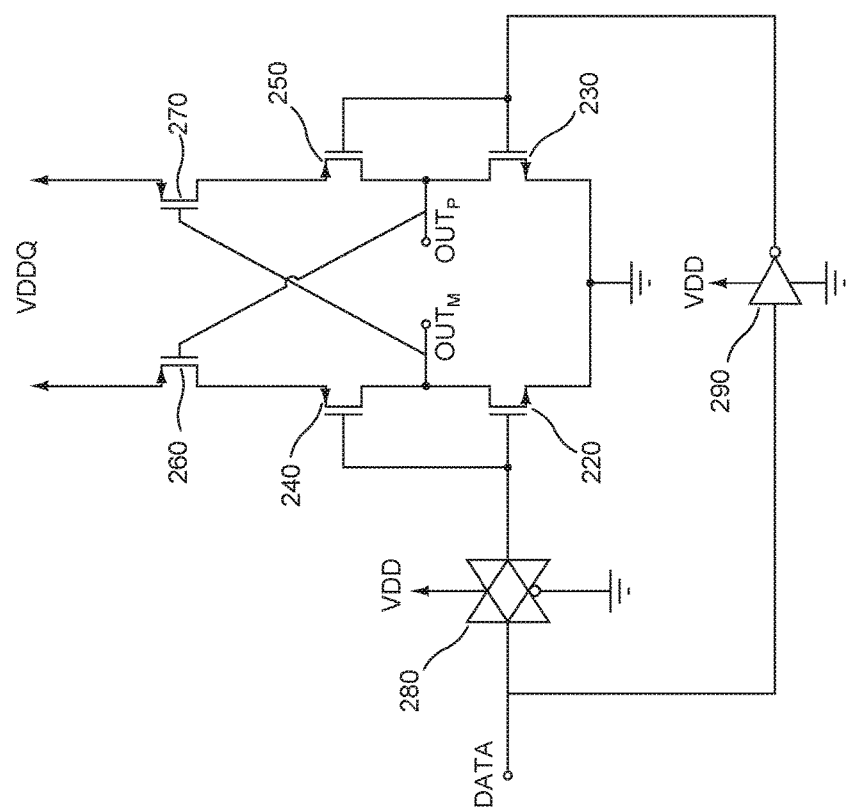
FIG. 2 is an illustration of a standard differential level shifter circuit.

FIG. 2 is a circuit drawing of a differential level shifter circuit, in accordance with some embodiments. The circuit is designed for a memory write operation from a microprocessor running at a core voltage less than the memory supply voltage. For example, the core voltage $V_{dd}$ of the microprocessor may be around 0.7 Volts, as discussed above. The input data signal is single-ended, swinging from around 0 Volts to the core voltage of around 0.7 Volts. A differential output is provided by the level shifter, which swings from around 0 Volts to $V_{ddq}$, where $V_{ddq}$ is larger than the core voltage $V_{dd}$. The single-ended input is initially converted to a differential signal using a transmission gate 280 and an inverter 290. The transmission gate 280 is fixed in the pass mode and is incorporated to introduce a delay in the non-inverting input path equal to that introduced by the inverter 290. The level translation is performed by a PMOS FET cross quad made up of PMOS transistors 240, 250, 260, and 270, and with NMOS FETs 220 and 230. The PMOS cross quad uses cross coupled terminals to generate positive feedback, enhancing the range and switching characteristics of the differential output signal. The differential output is taken from the drain terminals $OUT_M$ and $OUT_P$ of the NMOS transistors 220 and 230, where each terminal swings from around 0 Volts to $V_{ddq}$.

In some embodiments, during operation, the level shifter in FIG. 2 starts off with the data input at 0 Volts. The transmission gate 280 passes the data input so that the gate voltages of NMOS 220 and PMOS 240 are also around 0 Volts. The inverter 290 inverts the data input so that the gate voltages of NMOS 230 and PMOS 250 are around 0.7 Volts. Assume that the threshold voltages of the PMOS and NMOS devices are approximately 0.6 Volts. Then, NMOS 220 is off and NMOS 230 is on, with $OUT_P$ at around 0 Volts. This turns PMOS 260 all the way on, which pulls the source of PMOS 240 up to $V_{ddq}$. Since the gate voltage of PMOS 240 is at 0 Volts and the source of PMOS 240 is at $V_{ddq}$, PMOS 240 is all the way on and $OUT_M$ is pulled all the way to $V_{ddq}$ also. This in turn drives PMOS 270 into the off condition, providing no pull up current and re-enforcing the condition that OUT is around 0 Volts. This is the initial condition wherein the data input is low; PMOS 260, PMOS 240, and NMOS 230 are all on; PMOS 270, PMOS 250, and NMOS 220 are all off; $OUT_M$ is at $V_{ddq}$; and $OUT_P$ is around 0 Volts. This condition is stable and remains this way until the data input signal is switched.

Assume the initial condition described above for FIG. 1, and then suppose the data input is switched to 0.7 Volts. This turns NMOS 220 on and NMOS 230 off. It also changes the gate to source voltage of PMOS 240 from $V_{ddq}$ to $V_{ddq}-0.7$ Volts. Depending on the threshold voltage of the PMOS device, this may be sufficient to turn the PMOS 240 transistor off, or at least greatly reduce the pull up drain current that is sourced by PMOS 240. In one embodiment, the threshold voltage of PMOS 240 is 0.6 Volts. In other embodiments, other threshold voltages may exist. In the embodiment with a threshold voltage of PMOS 240 at 0.6 Volts, if the supply voltage $V_{ddq}$ is less than 1.3 Volts, then PMOS 240 will turn off. If $V_{ddq}$ is greater than or equal to 1.3 Volts, then PMOS 240 will source current with an overdrive voltage of $V_{ddq}-1.3$. Note that this contention between PMOS 240 sourcing current into node $OUT_M$ and NMOS 220 sinking current from node $OUT_M$ is worsened for greater memory supply voltage $V_{ddq}$. If the size of NMOS 220 is large enough, it will sink more current than is sourced by PMOS 240 and the node $OUT_M$ will be pulled to ground. This turns on PMOS 270. Since the gate voltage of PMOS 250 and NMOS 230 are at zero after having been inverted by the inverter 290, PMOS 250 will turn on hard, pulling $OUT_P$ up to $V_{ddq}$. This produces a zero gate to source voltage across PMOS 260, and consequently PMOS 260 turns off. At this point, any current that was being sourced by PMOS 240 stops and the circuit has switched.

In the above example operation with a data input switch from approximately 0 Volts to a $V_{dd}$ of approximately 0.7 Volts, $OUT_P$ swings from approximately 0 volts to $V_{ddq}$, and $OUT_M$ fully swings from $V_{ddq}$ to approximately 0 Volts. The reverse operation, when switching the data input from high to low, functions in the expected reciprocal manner.

Figure 3:
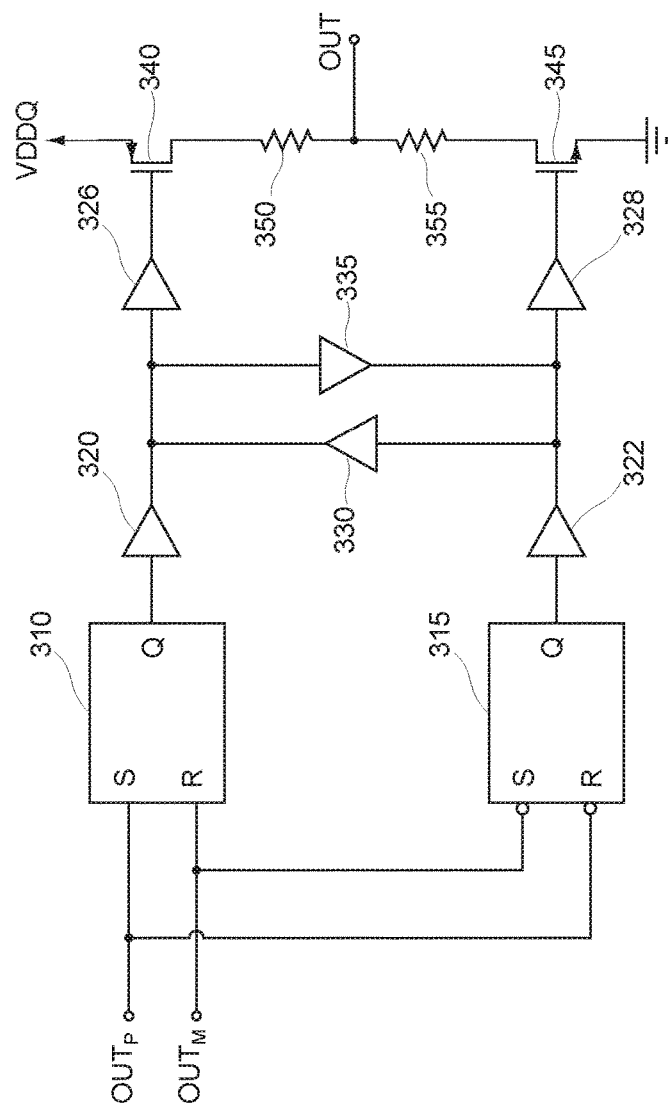
FIG. 3 illustrates an example duty cycle correction circuit used to square up a level translated signal and drive a DDR memory device.

FIG. 3 illustrates a duty cycle correction circuit used to square up the level translated signal and drive a DDR memory device, in accordance with some embodiments. The circuit makes use of two SR latches 310 and 315 to sense the outputs of the level shifter circuit. Amplifiers 320, 322, 326, and 328 provide buffering to drive the output stage that interfaces off-chip. When $OUT_P$ transitions to high and $OUT_M$ transitions to low, both SR latches 310 and 315 are set (because SR latch 315 is active low). This forces the output of amplifiers 320, 322, 326, and 328 high to $V_{ddq}$. PMOS 340 turns off and NMOS 345 turns on, pulling the output signal $OUT_P$ low. When $OUT_P$ transitions to low and $OUT_M$ transitions to high, both SR latches 310 and 315 are reset (because SR latch 315 is active low). This forces the output of amplifiers 320, 322, 326, and 328 low to ground. PMOS 340 turns on and NMOS 345 turns off, pulling the output signal, OUT, high to $V_{ddq}$. Source resistors 350 and 355 are added for transmission line impedance matching. Amplifiers 330 and 335 work to make sure that the gate voltages of PMOS 340 and NMOS 345 move together.

Figure 4:
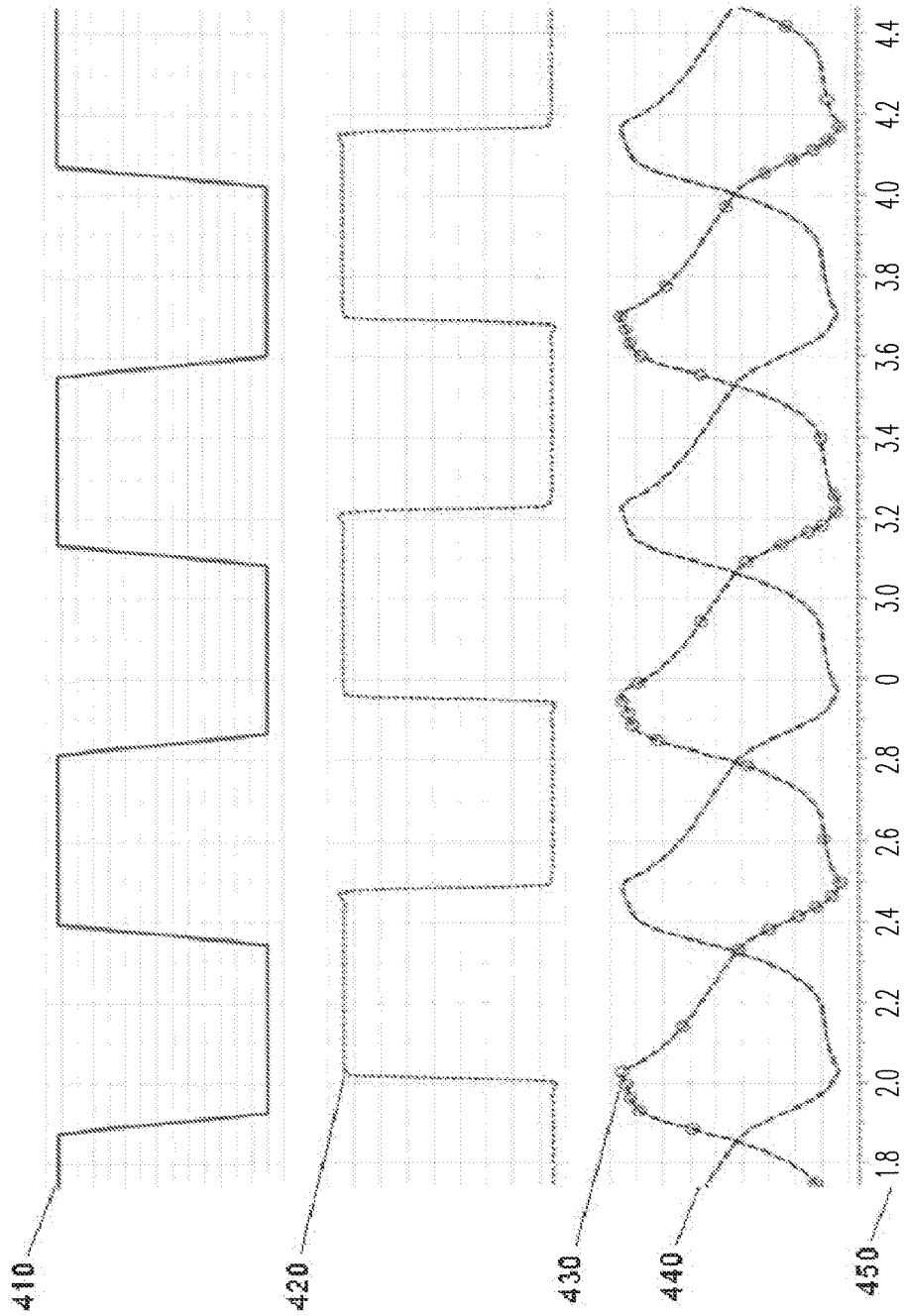
FIG. 4 illustrates an example operation of a level shifter and output circuit.

FIG. 4 illustrates an example operation of a level shifter and output circuit, in accordance with some embodiments. The embodiment of FIG. 4 shows the operation of the level shifter and output circuit in an example with a $V_{dd}$ of approximately 0.7 Volts and a $V_{ddq}$ of approximately 1.575 Volts. In other embodiments, other voltage values may be used. The input data signal 410 is shown switching between approximately 0 Volts and $V_{dd}$. The output of the driver circuit 420 is shown switching accordingly from 0 V and $V_{ddq}$. The differential outputs of the level shifter 430 and 440 are shown switching between approximately 0 Volts and $V_{ddq}$. The time scale 450 is also shown in nanoseconds. Here the duty cycle of the output of the driver circuit 420 is less than 45%, at least partly because the level shifter is failing to switch fast enough. If the core supply, $V_{dd}$, was lowered further or the memory supply, $V_{ddq}$, was increased further, this condition would worsen.

If $V_{ddq}$ is greater than approximately 1.3 Volts, then PMOS 240 will source current with an overdrive voltage of $V_{ddq}-V_{dd}-V_t$. NMOS 220 will sink current with an overdrive voltage $V_{dd}$-$V_t$. The pull up or sourcing current from PMOS 240 works against the pull down or sinking current through NMOS 220 and slows down the transition of $OUT_M$ from $V_{ddq}$ to approximately 0 Volts. This deleterious condition is exacerbated by increasing $V_{ddq}$ and by reducing $V_{dd}$. If $V_{ddq}$ is increased, then the overdrive and the sourcing current of PMOS 240 are also increased. If $V_{dd}$ is reduced, then the overdrive and the sinking current of NMOS 220 are also reduced. Therefore, the switching speed of the circuit is adversely affected as the range of voltage translation, $V_{ddq}$-$V_{dd}$, is increased. One method to counter this effect is to increase the size of NMOS 220. However, this increases the capacitive load presented to the previous stage and the chip area that is used to implement the level translator. Another method is to reduce the size of PMOS 240. However, this will also result in a slower pull up time during the reverse operation.

Figure 5:
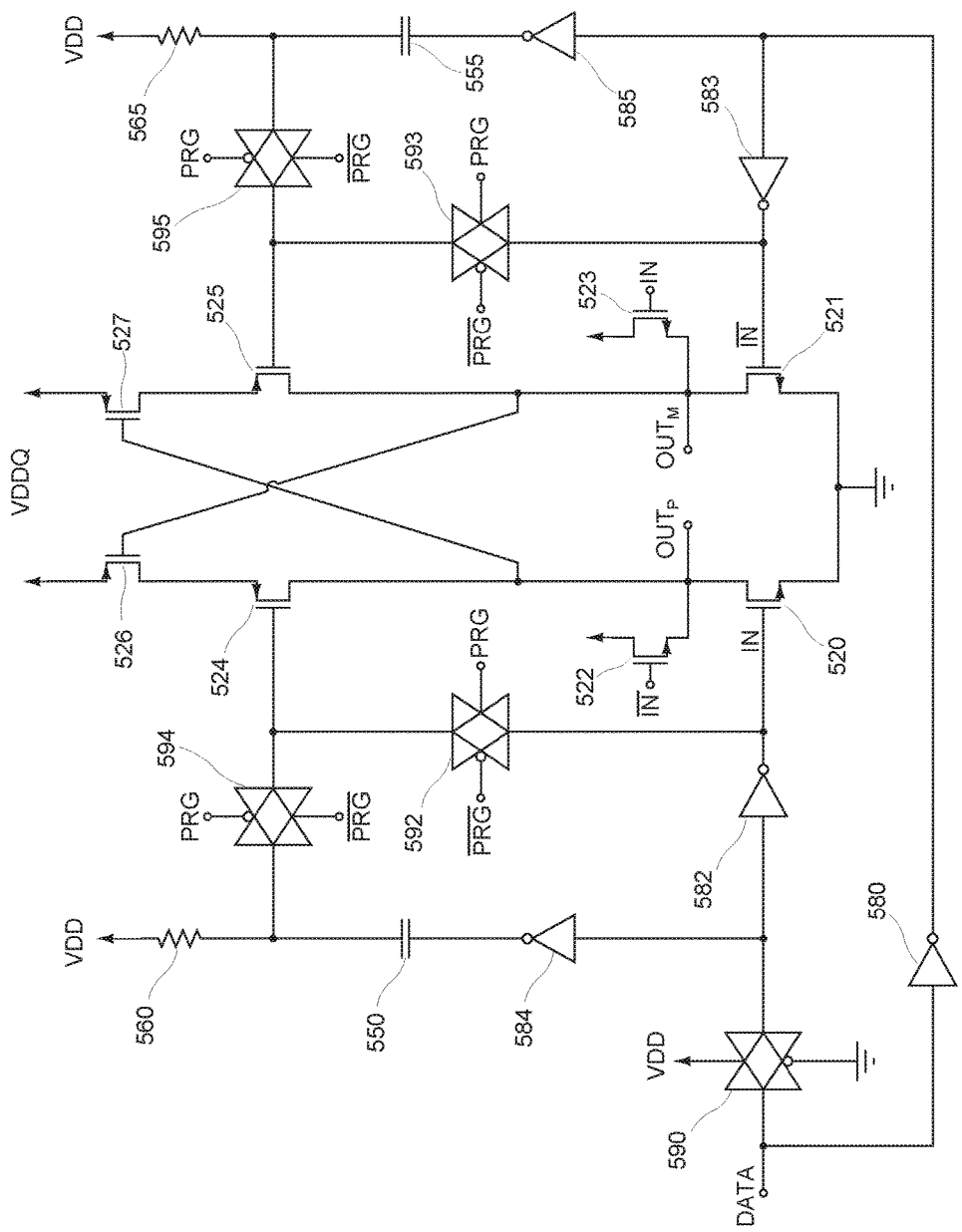
FIG. 5 illustrates an example level translator implemented with a charge pump to improve switching speed, in accordance with some embodiments.

FIG. 5 illustrates a level translator implemented with a charge pump to improve switching speed in accordance with some embodiments. The circuit of FIG. 5 includes an inverter 580 with a transmission gate 590 to create a balanced differential signal from the single-ended input. It also includes a PMOS cross quad made up of PMOS 524, 525, 526, and 527, and the NMOS pair 520 and 521. These transistors perform the level translation in a manner similar to that described for FIG. 2. Two charge pumps (e.g. including capacitors 550, 555) are added to mitigate the sourcing current/sinking current contention issue during switching. In some embodiments, inverters (e.g. inverters 582 and 583) are added for buffering and to maintain timing with the charge pumps. In other embodiments, other structures may be added to maintain timing with the charge pumps. All of the inverters operate from the microprocessor core voltage to provide compatibility with the input data signal.

The level translator is designed for use with different types of memory circuits that operate at different supply voltages. For this purpose, four transmission gates are included in the circuit of FIG. 5 to allow for programmable configuration between high supply mode (high $V_{ddq}$) and low supply mode (low $V_{ddq}$). With the program signal set to $V_{ddq}$ Volts (PRG=1, $\overline{PRG}$=0), transmission gates 592 and 593 are on and transmission gates 594 and 595 are off. In this mode the charge pumps are disconnected and the circuit can operate with a lower memory supply voltage $V_{ddq}$. In low supply mode, the level translator operates identically to the level translator in FIG. 2. This can be used for LPDDR3, DDR4, and LPDDR4 with operating memory supply voltages less than 1.3 Volts. When transitioning $OUT_P$ from high to low as described above and with the memory supply $V_{ddq}$ less than 1.3 Volts, the input data signal would push the gate voltage of PMOS 524 high enough to turn the transistor off. Therefore, when the output is switching, there is no pull-up/pull-down contention between the PMOS devices and the NMOS devices.

In high supply mode, the level translator operates with the charge pump actively connected in the circuit. High supply mode is engaged by setting the program signal to 0 Volts (PRG=0, $\overline{PRG}$=1). Then the transmission gates 594 and 595 are on and the transmission gates 592 and 593 are off. In this mode, the level translator can be used for DDR3, DDR3L, and older memory devices where the memory supply voltage $V_{ddq}$ is greater than approximately 1.3 Volts.

Assume that while the level translator is in high supply mode, the input data signal in FIG. 5 is initially high at $V_{dd}$. In this condition, the outputs of inverters 582 and 584 are low and the outputs of inverters 583 and 585 are high. Thus, PMOS 524, PMOS 526, and NMOS 521 are on, while PMOS 525, PMOS 527, and NMOS 520 are off. Assume that enough time has elapsed so that capacitor 550 has charged to $V_{dd}$ and capacitor 555 has discharged to zero. Note here that the gate voltage of PMOS 524 is $V_{dd}$. Therefore, with a memory supply voltage $V_{ddq}$ of at least 1.3 Volts, the gate to source voltage of PMOS 524 ($V_{ddq}$-$V_{dd}$) is at least 0.6 Volts, which is enough to keep PMOS 524 on and the circuit stable. In this initial state, $OUT_P$ is at $V_{ddq}$ and $OUT_M$ is around 0 Volts.

Next, the input data signal switches to approximately 0 Volts. The outputs of inverters 582 and 584 switch to $V_{dd}$ and the outputs of inverters 583 and 585 switch to approximately 0 Volts. This turns on NMOS 520 and turns off NMOS 521. At the same time, the charge pump pushes the gate voltage of PMOS 524 above $V_{dd}$. Recall that before the input data switches, the charge stored on the capacitor 550 is Q=C·$V_{dd}$ (where C is the capacitance of capacitor 555). As the output of the inverter 584 rises, a substantial portion of this charge is transferred (or pumped) through the transmission gate 594 and onto the gate of PMOS 524. The source voltage of PMOS 524 is at $V_{ddq}$ by the pull-up through PMOS 526. Therefore, the gate to source voltage of PMOS 524

$$V_{ddq} - V_{dd} + \frac{Q}{C_{eq}},$$

where Q was the charge stored on the capacitor 550 and $C_{eq} \approx C + C_{gs} + C_{gd}$ is the equivalent capacitance at the gate of PMOS 524. (This is only an approximate analysis, as other parasitic capacitances exist resulting from the transmission gates 592 and 594, and possibly from the capacitor 550 or the resistor 560. Further, output of the inverter 584 will not switch instantaneously, and so as $OUT_P$ increases, there will be charge dissipated through the resistor 560 and charge injected onto the gate of PMOS 524 through $C_{gd}$.) Therefore, after switching, the gate to source voltage of PMOS 524 is approximately:

$$V_{gs} \approx V_{ddq} - V_{dd} + \frac{Q}{C_{eq}} \approx V_{ddq} - V_{dd} + \frac{C}{C + C_{gs} + C_{gd}} V_{dd}$$

This reduces the magnitude of the gate to source voltage of PMOS 524 enough to turn it off. Consequently, no current (or very little current) is sourced by PMOS 524, and NMOS 520 can pull down OUT without contention from PMOS 524. After some settling time, the voltage across capacitor 550 will discharge to 0 Volts through the resistor 560, and the gate voltage of PMOS 524 will settle back down to $V_{dd}$. At this point, PMOS 526 will have turned off (as a result of switching on the opposing side with PMOS 527 and 525), preventing any current sourcing from PMOS 524 to the output node $OUT_P$.

While $OUT_P$ transitions from high to low, $OUT_M$ transitions from low to high. As already discussed, NMOS 521 is off and at the beginning of the switch, the voltage across capacitor 555 is 0 Volts. When the output of inverter 585 transitions from $V_{dd}$ to 0 Volts, a substantial portion of the (positive) charge on the gate of PMOS 525 is transferred to the capacitor 555. This pulls the gate voltage of PMOS 525 down below $V_{dd}$. At the same time, the gate voltage of PMOS 527 is pulled down to 0 Volts, and so PMOS 527 and PMOS 525 turn on hard. This facilitates the rapid pull up of $OUT_M$ to $V_{ddq}$. After some settling time, the voltage across the capacitor 555 charges to $V_{dd}$ through the resistor 565 and the gate voltage of PMOS 525 settles to $V_{dd}$.

The transition for the input data signal from high to low is identical to the operation described above. The time constant $\tau = C_{eq}R$ is set so that the capacitors 550 and 555 have sufficient time to charge and discharge during switching. Further, the capacitors 550 and 555 are designed to ensure that the charge delivered to the gates of PMOS 524 and 525 is sufficient to avoid the current-sourcing-current-sinking contention problem during the pull-down of either $OUT_M$ or $OUT_P$.

Finally, NMOS transistors 522 and 523 are added to prevent the drain voltages of NMOS 520 and 521 from dropping below 0 Volts. This possibility exists as a result of the gate to drain capacitance of NMOS 520 and 521. When the input data signal goes high, IN transitions from $V_{dd}$ to 0 Volts and $\overline{IN}$ transitions from 0 Volts to $V_{dd}$. Since $OUT_P$ is initially at 0 Volts, the gate to drain capacitive feed-through may force $OUT_P$ to initially fall below 0 Volts during the switch. However, at the same time that IN goes low, $\overline{IN}$ goes high, and in the event that the drain voltage of NMOS 520 drops below zero, NMOS 522 turns on and stops it. This prevents $OUT_P$ from possibly falling below 0 Volts. Once $OUT_P$ starts to rise, NMOS 522 turns off and does not affect further circuit operation. The same can be said for NMOS 523 on the opposing side of the NMOS pair 520 and 521.

Figure 6:
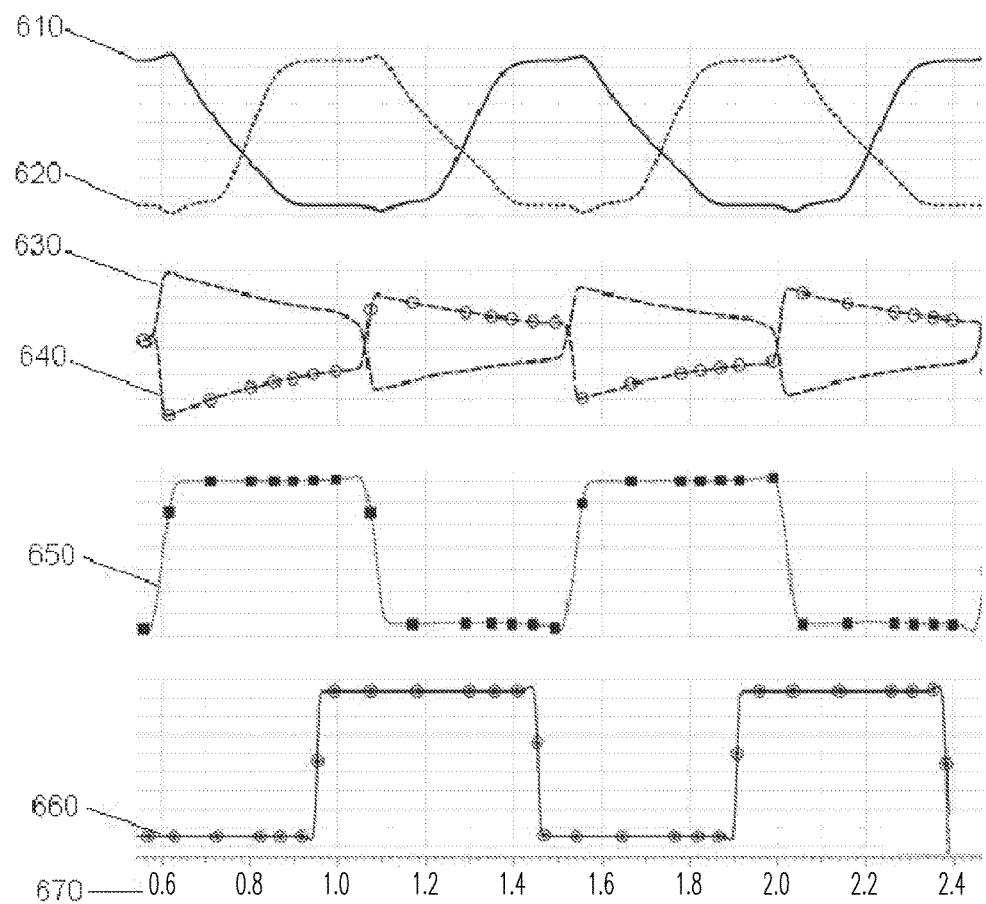
FIG. 6 illustrates an example operation of a level shifter for a memory high-supply voltage, in accordance with some embodiments.

FIG. 6 illustrates an example operation of a level shifter for a memory high-supply voltage, in accordance with some embodiments. In the embodiment of FIG. 6, an example level shifter for a memory high supply voltage with $V_{ddq}$ around 1.575 Volts is illustrated. Particularly, this is a worst-case simulation at the process corner slow-slow (SS), at −40 degrees Centigrade with $V_{dd}$ at 0.65 Volts and $V_{ddq}$ around 1.575 Volts. The slow-slow condition indicates that the tolerance conditions for physical layer thicknesses and etching dimensions along with the doping levels for NMOS and PMOS transistors (controlling for electron mobility and hole mobility) came out on the low side. The low temperature increase the threshold voltage further. Further worst-case conditions include maximum disparity between microprocessor core voltage and the I/O supply voltage; the microprocessor is simulated with the lowest core voltage $V_{dd}$ and with the highest I/O supply voltage $V_{ddq}$. When operating in this mode, the level shifter PRG is set to 0 Volts with the charge pump engaged. The input data signal 650 switching from approximately 0 to 0.65 Volts and the output signal after the duty cycle correction circuit 660 switching from approximately 0 to 1.575 Volts are plotted against time 670 in nanoseconds (ns). The bit rate is simulated at 2133 megabits per second for a bit period of approximately 0.469 ns.

The outputs of the level shifter $OUT_P$ 610 and $OUT_M$ 620 are shown with the gate voltage 630 of PMOS 524 and the gate voltage 640 of PMOS 525. Here it can be seen that the charge pump pushes the gate voltage 630 of PMOS 524 well above $V_{dd}$, which turns PMOS 524 off as described above and allows $OUT_P$ 610 to transition down from 1.575 Volts to 0 Volts. Then the gate voltage 630 of PMOS 524 settles back to $V_{dd}$ as capacitor 550 discharges through the resistor 560. Then, on the subsequent pull-up of $OUT_P$ 610, the gate voltage 630 of PMOS 524 is pulled well below $V_{dd}$ which facilitates the pull-up of $OUT_P$ 610. With the supply voltage levels listed above, the circuit exhibits a duty cycle of between 48.9% and 53% depending on the tolerance and temperature simulation conditions.

Figure 7:
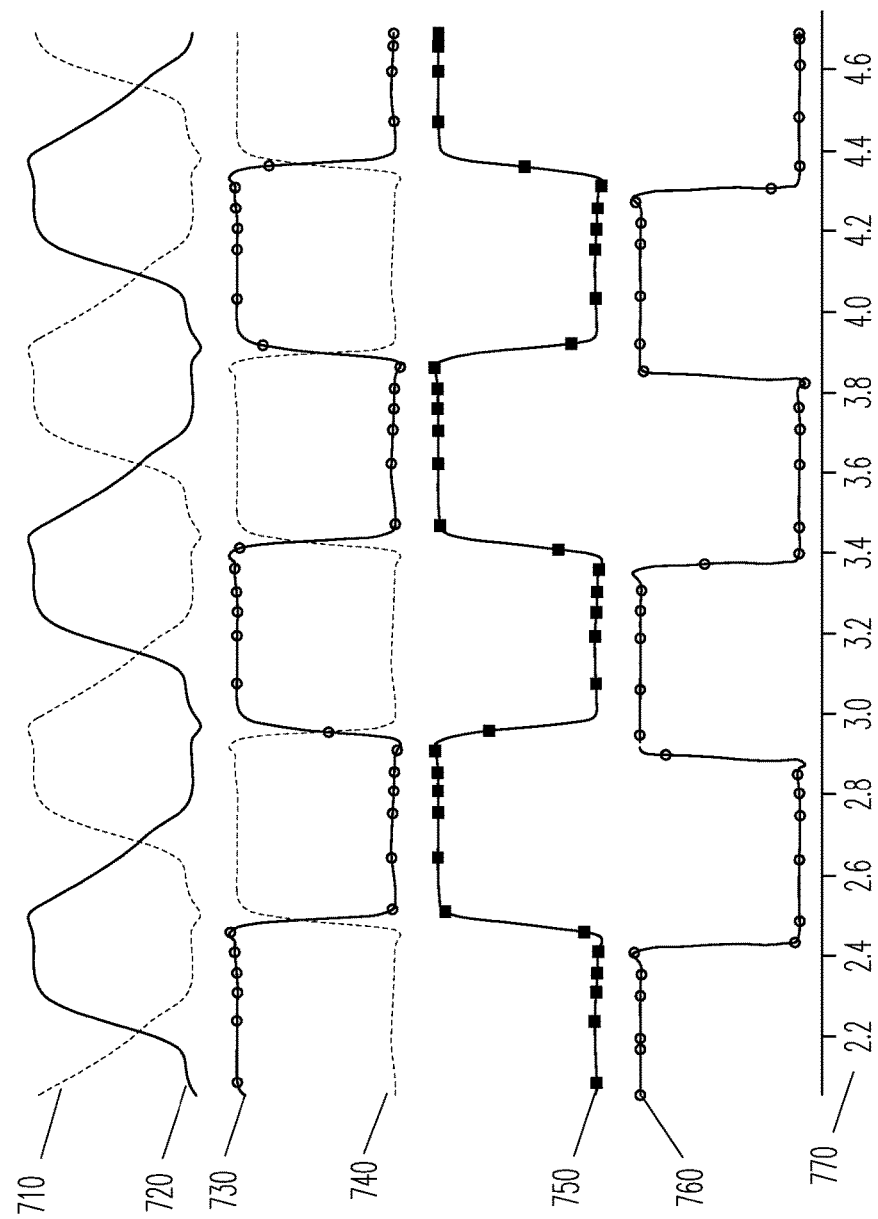
FIG. 7 illustrates an example operation of a level shifter for a memory low-supply voltage, in accordance with some embodiments.

FIG. 7 illustrates an example operation of a level shifter for a memory low-supply voltage, in accordance with some embodiments. FIG. 7 illustrates the operation of the level shifter for a memory low-supply voltage with $V_{ddq}$ at 1.3 Volts, in accordance with some embodiments. Particularly, this is a worst-case simulation at the process corner slow-slow (SS), at −40 degrees Centigrade with $V_{dd}$ around 0.65 Volts and $V_{ddq}$ around 1.3 Volts. When operating in this mode, the level shifter PRG is set to $V_{ddq}$ around 1.3 Volts with the charge pump disengaged. The input data signal 750 switching from approximately 0 to 0.65 Volts and the output signal after the duty cycle correction circuit 760 switching from approximately 0 to 1.3 Volts are plotted against time 770 in nanoseconds (ns). The bit rate is simulated at 2133 megabits per second for a bit period of around 0.469 ns.

The outputs of the level shifter $OUT_P$ 710 and $OUT_M$ 720 are shown with the gate voltage 730 of PMOS 524 and the gate voltage 740 of PMOS 525. Here it can be seen that without the charge pump, the gate voltages 730 and 740 transition between 0 and $V_{dd}$ on each cycle. With the supply voltage levels listed above, the circuit exhibits a duty cycle approximately between 49.8% and 52.4% depending on the tolerance and temperature simulation conditions.

Figure 8A:
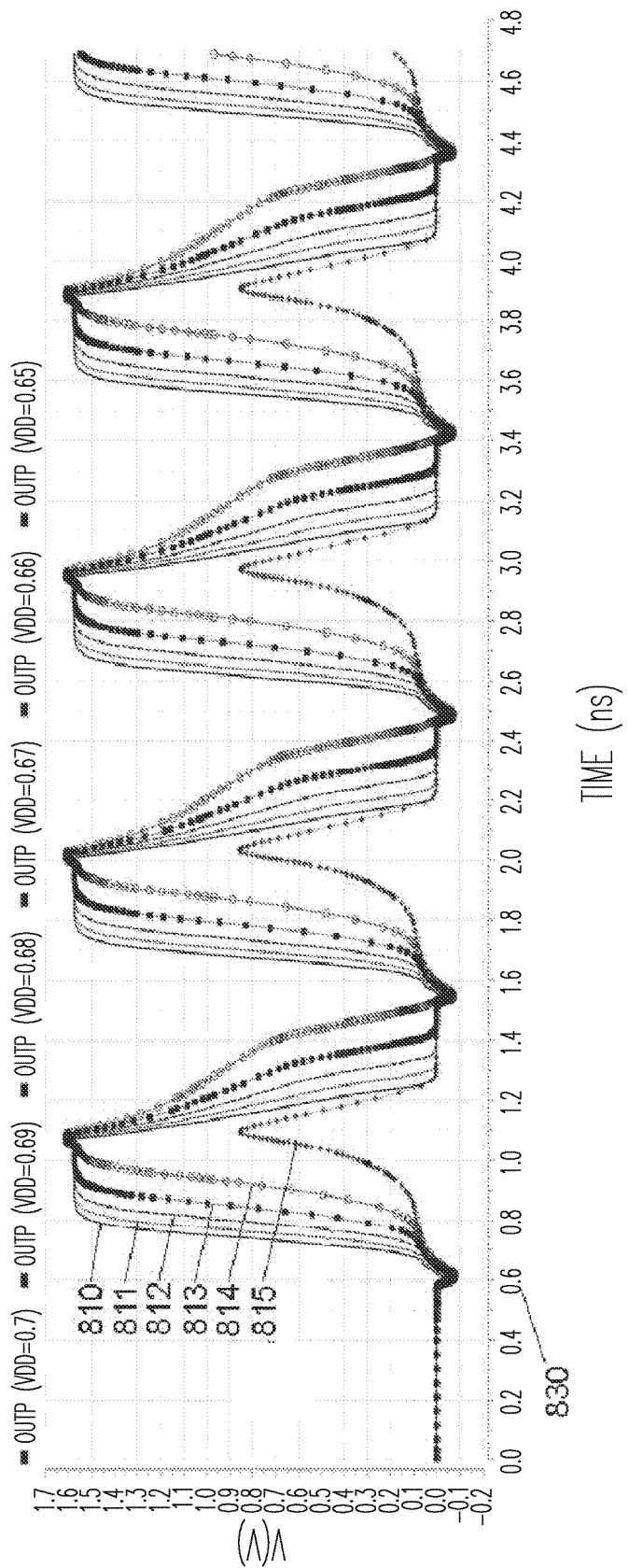
FIG. 8 illustrates an example output of a level translator without a charge pump and with the charge pump active, in accordance with some embodiments.
Figure 8B:
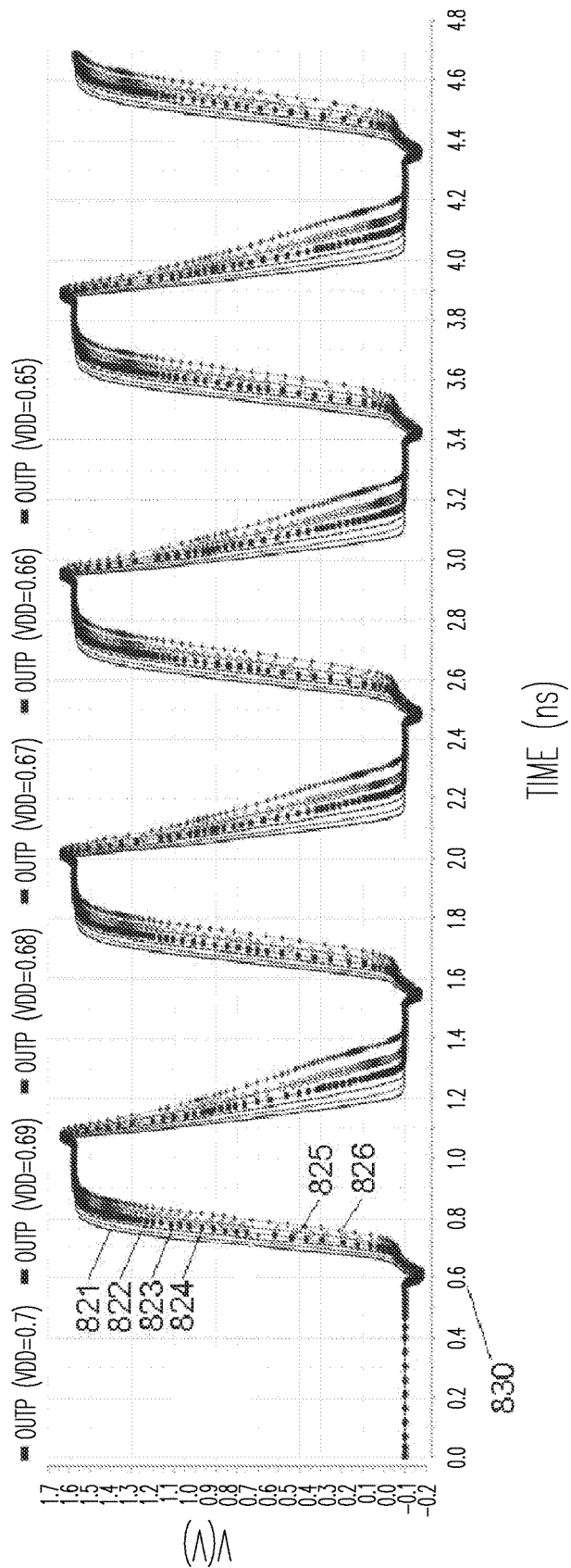

FIG. 8 illustrates the output ($OUT_P$) of the level translator without the charge pump and with the charge pump active, in accordance with some embodiments. The memory power supply is set to $V_{ddq}$=1.575 Volts, and the circuit is switching at 2133 Mbps. The time access 830 is shown in nanoseconds. The 810 series shows the output signal $OUT_P$ transitioning with progressively lower and lower microprocessor core voltages ($V_{dd}$) using the level shifter architecture described in FIG. 2.

$OUT_P$ 810 is simulated with $V_{dd}$=0.7 Volts.
$OUT_P$ 811 is simulated with $V_{dd}$=0.69 Volts.
$OUT_P$ 812 is simulated with $V_{dd}$=0.68 Volts.
$OUT_P$ 813 is simulated with $V_{dd}$=0.67 Volts.
$OUT_P$ 814 is simulated with $V_{dd}$=0.66 Volts.
$OUT_P$ 815 is simulated with $V_{dd}$=0.65 Volts.

The 820 series shows the output signal $OUT_P$ transitioning with progressively lower and lower microprocessor core voltages ($V_{dd}$) using the level shifter architecture described in FIG. 5 with the charge pump active (PRG=0).

$OUT_P$ 821 is simulated with $V_{dd}$=0.7 Volts.
$OUT_P$ 822 is simulated with $V_{dd}$=0.69 Volts.
$OUT_P$ 823 is simulated with $V_{dd}$=0.68 Volts.
$OUT_P$ 824 is simulated with $V_{dd}$=0.67 Volts.
$OUT_P$ 825 is simulated with $V_{dd}$=0.66 Volts.
$OUT_P$ 826 is simulated with $V_{dd}$=0.65 Volts.

Here it can be seen that without the charge pump (the 810 series), as the microprocessor core voltage gets lower, the current-sourcing-current-sinking contention issue between NMOS/PMOS pairs becomes successively worse until the circuit fails to switch. With the charge pump active (the 820 series), this issue is resolved.

Figure 9:
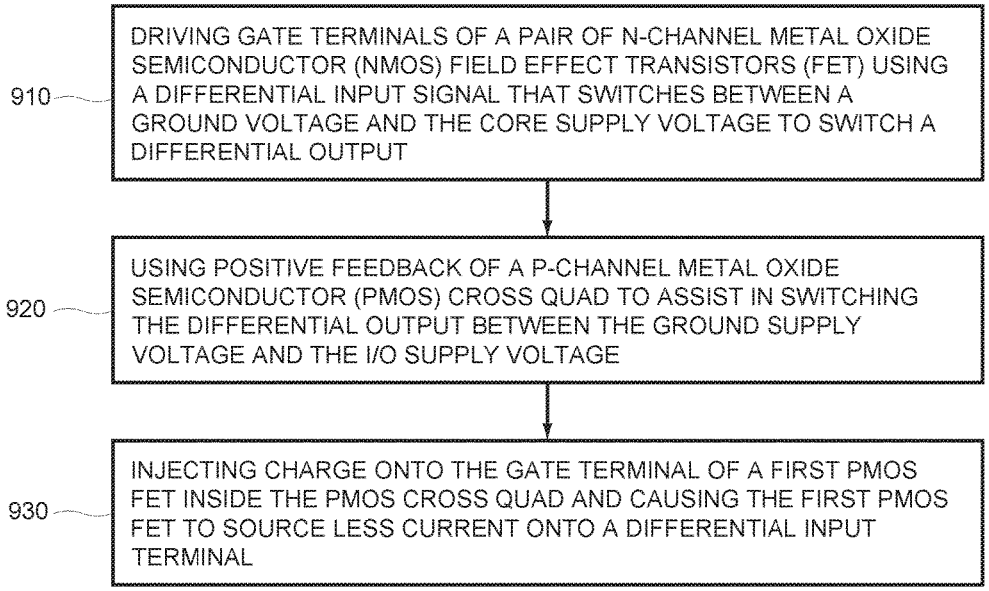
FIG. 9 illustrates an operational flow of driving a memory device, in accordance with some embodiments.

FIG. 9 illustrates the operational flow of driving a memory device in accordance with some embodiments. The method describes a memory device operating on an input/output (I/O) supply voltage from a microprocessor operating on a core supply voltage in accordance with some embodiments. In operation 910, the gate terminals of a pair of NMOS transistors are driven from a differential input signal that swings between ground and the core supply voltage level. The differential input signal may be generated from a single-ended data signal through some method of single-ended to differential conversion. The drain terminals of the NMOS transistors are connected to the differential output and they are also connected to a PMOS cross quad. In operation 920, the PMOS cross quad assists the NMOS transistors to switch the differential output between ground voltage and the I/O supply voltage. The PMOS cross quad uses positive feedback by cross coupling the gates of the upper pair of PMOS transistors to the differential output. The source terminals of the upper pair of PMOS transistors are directly connected to the I/O supply or connected through some other device to the I/O supply. The drain terminals of the lower PMOS transistors are also directly connected to the differential output or connected through some other device to the differential output. The source terminals of the lower PMOS transistors are directly connected to the drain terminals of the upper PMOS transistors or they are connected through some device. In operation 930, charge is injected onto the gate terminal of one of the lower PMOS transistors. This operation is performed while the corresponding NMOS transistor is pulling the source node (and differential output terminal) down. The charge injected onto the gate prevents the PMOS transistor from sourcing current, or at least reduces the current sourced by the PMOS transistor. This allows the differential output terminal to pull down in less time so as to facilitate a faster transition.

At the same time that charge is injected onto the gate of one of the lower PMOS transistors, charge is removed from the gate of the opposing lower PMOS transistor in the PMOS cross quad. This increases the current being sourced by the opposing lower PMOS transistor and pulls the opposing differential output terminal up faster. This also facilitates a faster transition.

The charge injection onto and charge removal from the gates of the lower PMOS transistors is performed by a pair of charge pumps. One simple way of implementing the charge pump is with a resistor and a capacitor. One terminal of the capacitor is driven by an inverting buffer stage. The other terminal of the capacitor is connected to the gate of the lower PMOS transistor. A resistor also connects the gate terminal of the PMOS transistor and the capacitor to the core supply voltage. The capacitor charges and discharges between switching transients from a low voltage to a high voltage (e.g. 0 Volts to $V_{dd}$.) In various embodiments, if the capacitor is made large enough, a significant amount of charge can be injected onto the gate of the PMOS transistor when the buffer output of the inverting buffer switches high, and also removed from the gate of the PMOS transistor when the buffer output is switching low. The RC time constant can be set such that the capacitor will charge and discharge quickly enough to keep pace with the switching speed of the DDR memory clock.

Finally, a pair of high supply transmission gates can be inserted between the charge pump outputs and the lower PMOS gate terminals. Another pair of transmission gates can be inserted between the inverting buffer outputs and the lower PMOS gate terminals. Then, depending on the I/O power supply level, the charge pumps can be engaged or bypassed. This provides the level translation driver circuit with compatible flexibility to drive various DDR memories with different I/O supply voltages.

Figure 10:
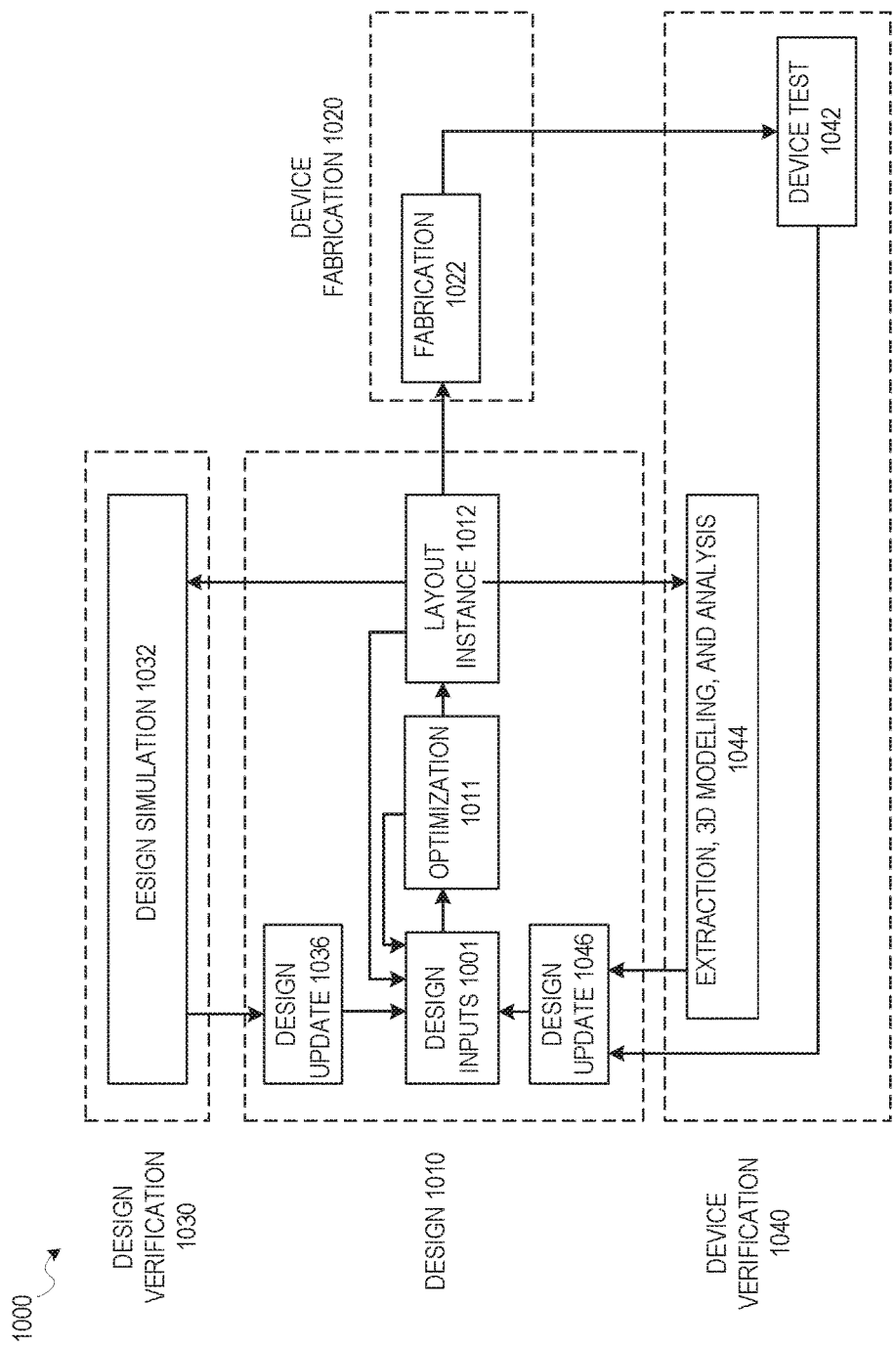
FIG. 10 is a diagram illustrating one example design process flow for generating a circuit, including embodiments to implement I/O driver circuits to interface a microprocessor with memory.

FIG. 10 is a diagram illustrating one possible design process flow for generating a circuit, including embodiments to implement I/O driver circuits to interface a microprocessor with memory, and in various embodiments, to integrate with a larger integrated circuit comprising different design blocks. As illustrated, the overall design flow 1000 includes a design phase 1010, a device fabrication phase 1020, a design verification phase 1030, and a device verification phase 1040. The design phase 1010 involves an initial design input operation 1001 where the basic elements and functionality of a device are determined, as well as revisions based on various analyses and optimization of a circuit design. This design input operation 1001 is where instances of an EDA circuit design file are used in the design and any additional circuitry is selected. The initial strategy, tactics, and context for the device to be created are also generated in the design input operation 1001, depending on the particular design algorithm to be used.

In some embodiments, following an initial selection of design values in the design input operation 1001, timing analysis and optimization according to various embodiments occurs in an optimization operation 1011, along with any other automated design processes. One such process may be the automated design of control circuitry to switch a DDR programmable level translator device depending on the type of DDR memory being accessed. As described below, design constraints for blocks of a circuit design generated with design inputs in the design input operation 1001 may be analyzed using hierarchical timing analysis, according to various embodiments. While the design flow 1000 shows such optimization occurring prior to a layout instance 1012, such hierarchical timing analysis and optimization may be performed at any time to verify operation of a circuit design. For example, in various embodiments, constraints for blocks in a circuit design may be generated prior to routing of connections in the circuit design, after routing, during register transfer level (RTL) operations, or as part of a final signoff optimization or verification prior to a device fabrication operation 1022.

After design inputs are used in the design input operation 1001 to generate a circuit layout, and any optimization operations 1011 are performed, a layout is generated in the layout instance 1012. The layout describes the physical layout dimensions of the device that match the design inputs. This layout may then be used in the device fabrication operation 1022 to generate a device, or additional testing and design updates may be performed using designer inputs or automated updates based on design simulation 1032 operations or extraction, 3D modeling and analysis 1044 operations. Once the device is generated, the device can be tested as part of device test 1042 operations, and layout modifications generated based on actual device performance.

As described in more detail below, design updates 1036 from the design simulation 1032, design updates 1046 from the device test 1042 or the 3D modeling and analysis 1044 operations, or the design input operation 1001 may occur after an initial layout instance 1012 is generated. In various embodiments, whenever design inputs are used to update or change an aspect of a circuit design, a timing analysis and optimization operation 1011 may be performed.

For example, in various embodiments, a user may provide an input to an EDA computing device indicating placement of elements of a circuit within a first portion of a circuit design, including description of circuitry for charge pump level translation in high-speed memory. An output to a display of the EDA computing device may show details of a circuit design, and may further be used to generate results of the timing analysis, or may show recommended optimizations or automatically performed adjustments to the circuit design based on the timing analysis. Further inputs to the EDA computing device may involve adjustments as user design inputs, with additional timing analysis and optimization initiated via user operation of the EDA computing device. In some embodiments, an EDA computing device may be used to generate circuit design files describing circuitry corresponding to embodiments described herein.

Such circuit design files may be used as outputs to generate photolithographic masks or other control files and components used to generate circuits that operate in accordance with various embodiments described herein.

For example, one implementation in accordance with some embodiments is a method for driving a memory device operating on an input/output (I/O) supply voltage from a microprocessor operating on a core supply voltage, with a set of operations including the following: driving gate terminals of a pair of N-channel metal oxide semiconductor (NMOS) field effect transistors (FETs) using a differential input signal that switches between a ground voltage to the core supply voltage to switch a differential output; using positive feedback of a P-channel metal oxide semiconductor (PMOS) cross quad to assist in switching the differential output between the ground voltage and the I/O supply voltage; and injecting charge onto a gate terminal of a first lower PMOS FET inside the PMOS cross quad by using charge pump capacitor and causing the first lower PMOS FET to source less current onto a differential output terminal. Some such embodiment operate where the core supply voltage is less than the I/O supply voltage.

Additional examples in accordance with some embodiments are an apparatus configured for the following operations or a non-transitory computer readable medium comprising instructions that, when executed by one or more processors of an electronic design automation (EDA) computing device machine, cause the EDA computing device machine to perform operations including the following: selecting elements of a high-speed level translation memory driver to drive a double data rate (DDR) memory operating on an input/output (I/O) supply voltage from a microprocessor operating on a core supply voltage; configuring a pair of N-channel metal oxide semiconductor (NMOS) field effect transistors (FET) to switch a differential output; configuring a P-channel metal oxide semiconductor (PMOS) cross quad to assist in switching the differential output between a ground voltage and the I/O supply voltage wherein two source terminals in the PMOS cross quad are connected to the I/O supply voltage and two drain terminals in the PMOS cross quad are connected to the differential output; configuring a pair of charge pumps to inject charge onto gate terminals of a pair of PMOS FETs inside the PMOS cross quad; and generating a circuit design file comprising the high-speed level translation memory driver circuitry. Some such embodiments further configure a single-ended to differential converter to operate on the core supply voltage and to drive gate terminals of the pair of NMOS FETs from a single-ended data input signal.

An additional embodiment is a high-speed level translation memory driver apparatus comprising a P-channel metal oxide semiconductor (PMOS) field effect transistor (FET) cross quad comprising: a first upper PMOS FET with a source terminal connected to an input/output (I/O) power supply voltage and with a gate terminal that is cross connected to a differential output; a second upper PMOS FET with a source terminal connected to the input/output (I/O) power supply voltage and with a gate terminal that is cross connected to the differential output; a first lower PMOS FET with a source terminal connected to the drain terminals of the first upper PMOS FET and with a drain terminal of the first lower PMOS FET connected to the differential output; and a second lower PMOS FET with a source terminal connected to the drain terminals of the second upper PMOS FET and with a drain terminal of second lower PMOS FET connected to the differential output The embodiment additionally comprises a first N-channel metal oxide semiconductor (NMOS) FET with a source terminal connected to ground and with a drain terminal connected to the differential output; a second NMOS FET with a source terminal connected to ground and with a drain terminal connected to the differential output; a first differential input terminal connected to a gate terminal of the first NMOS FET; a second differential input terminal connected to a gate terminal of the second NMOS FET; a first charge pump comprising a first charge pump input connected to the first differential input terminal and further comprising a first charge pump output connected to a gate terminal of the first lower PMOS FET; and a second charge pump comprising a second charge pump input connected to the second differential input terminal and further comprising a second charge pump output connected to a gate terminal of the second lower PMOS FET.

Figure 11:
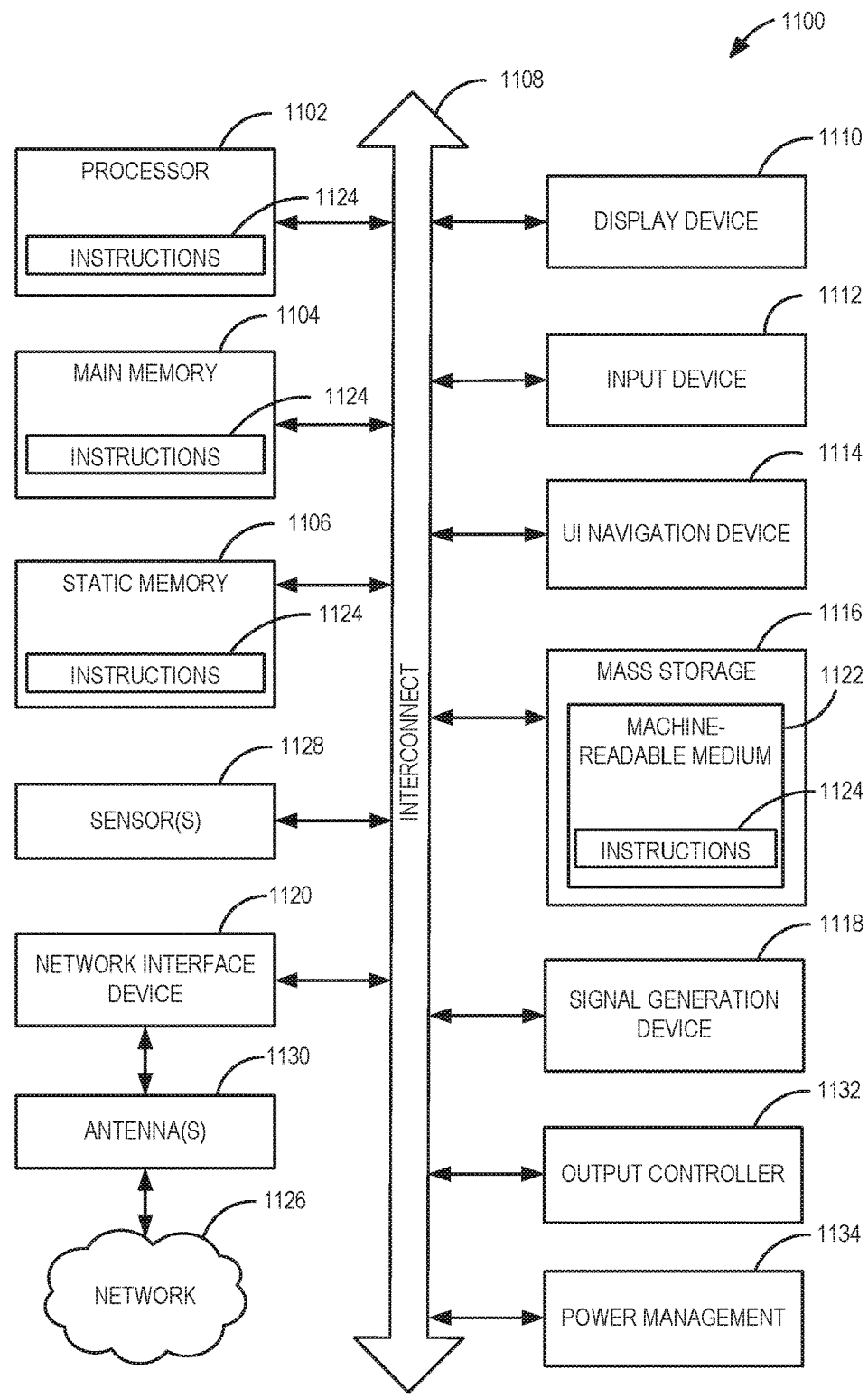
FIG. 11 is a block diagram illustrating an example computing machine upon which some embodiments discussed herein can be run.

FIG. 11 is a block diagram illustrating an example computing machine 1100 upon which some embodiments discussed herein can be run. The computing machine 1100 or elements of the computing machine 1100 may be used to implement any device, such as a mobile phone, tablet, wireless laptop, or any other such device described herein. In various other embodiments, different device components or multiple of any element may be used in different devices. Some embodiments may involve the use of a computing machine 1100 running electronic design automation tools to aid in the design and creation of hardware systems. In various alternative embodiments, the computing machine operates as a standalone device or can be connected (e.g., networked) to other machines. In a networked deployment, the machine can operate in the capacity of either a server or a client machine in server-client network environments, or it can act as a peer machine in peer-to-peer (or distributed) network environments. The machine can be a personal computer (PC) that may or may not be portable (e.g., a notebook or a netbook), a tablet, a set-top box (STB), a Personal Digital Assistant (PDA), a mobile telephone or smartphone, a web appliance, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein.

The example computing machine 1100 includes a processor 1102 (e.g., a central processing unit (CPU), a graphics processing unit (GPU), or both), a main memory 1104, and a static memory 1106, which communicate with each other via an interconnect 1108 (e.g., a link, a bus, etc.). The computing machine 1100 can further include a video display device 1110, an alphanumeric input device 1112 (e.g., a keyboard), and a user interface (UI) navigation device 1114 (e.g., a mouse). In some embodiments, the video display unit 1110, alphanumeric input device 1112, and UI navigation device 1114 are a touch screen display. The computing machine 1100 can additionally include a mass storage device 1116 (e.g., a drive unit), a signal generation device 1118 (e.g., a speaker), an output controller 1132, a power management controller 1134, a network interface device 1120 (which can include or operably communicate with one or more antennas 1130, transceivers, or other wireless communications hardware), and one or more sensors 1128.

The storage device 1116 includes a machine-readable medium 1122 on which is stored one or more sets of data structures and instructions 1124 (e.g., software) embodying or utilized by any one or more of the methodologies or functions described herein. The instructions 1124 can also reside, completely or at least partially, within the main memory 1104, within the static memory 1106, and/or within the processor 1102 during execution thereof by the computing machine 1100, with the main memory 1104, the static memory 1106, and the processor 1102 also constituting machine-readable media.

While the machine-readable medium 1122 is illustrated in an example embodiment to be a single medium, the term "machine-readable medium" can include a single medium or multiple media (e.g., a centralized or distributed database, and/or associated caches and servers) that store the one or more instructions 1124. The term "machine-readable medium" shall also be taken to include any tangible medium that is capable of storing, encoding, or carrying instructions for execution by the computing machine 1100 and that cause the computing machine 1100 to perform any one or more of the methodologies of the present disclosure, or that is capable of storing, encoding, or carrying data structures utilized by or associated with such instructions.

Various techniques, or certain aspects or portions thereof, may take the form of program code (e.g., instructions) embodied in tangible media, such as floppy diskettes, CD-ROMs, hard drives, non-transitory computer readable storage media, or any other machine-readable storage medium wherein, when the program code is loaded into and executed by a machine, such as a computer, the machine becomes an apparatus for practicing the various techniques. In the case of program code execution on programmable computers, the computing device may include a processor, a storage medium readable by the processor (including volatile and non-volatile memory and/or storage elements), at least one input device, and at least one output device. The volatile and non-volatile memory and/or storage elements may be a RAM, Electrically Programmable Read-Only Memory (EPROM), flash drive, optical drive, magnetic hard drive, or other medium for storing electronic data. One or more programs that may implement or utilize the various techniques described herein may use an application programming interface (API), reusable controls, and the like. Such programs may be implemented in a high level procedural or object oriented programming language to communicate with a computer system. However, the program(s) may be implemented in assembly or machine language, if desired. In any case, the language may be a compiled or interpreted language, and combined with hardware implementations.

The embodiments described above can be implemented in one or a combination of hardware, firmware, and software. Various methods or techniques, or certain aspects or portions thereof, can take the form of program code (e.g., instructions) embodied in tangible media, such as flash memory, hard drives, portable storage devices, read-only memory (ROM), RAM, semiconductor memory devices (e.g., EPROM, Electrically Erasable Programmable Read-Only Memory (EEPROM)), magnetic disk storage media, optical storage media, and any other machine-readable storage medium or storage device wherein, when the program code is loaded into and executed by a machine, such as a computer or networking device, the machine becomes an apparatus for practicing the various techniques.

A machine-readable storage medium or other storage device can include any non-transitory mechanism for storing information in a form readable by a machine (e.g., a computer). In the case of program code executing on programmable computers, the computing device can include a processor, a storage medium readable by the processor (including volatile and non-volatile memory and/or storage elements), at least one input device, and at least one output device. One or more programs that can implement or utilize the various techniques described herein can use an API, reusable controls, and the like. Such programs can be implemented in a high level procedural or object oriented programming language to communicate with a computer system. However, the program(s) can be implemented in assembly or machine language, if desired. In any case, the language can be a compiled or interpreted language, and combined with hardware implementations.

It should be understood that the functional units or capabilities described in this specification can have been referred to or labeled as components or modules, in order to more particularly emphasize their implementation independence. For example, a component or module can be implemented as a hardware circuit comprising custom very-large-scale integration (VLSI) circuits or gate arrays, off-the-shelf semiconductors such as logic chips, transistors, or other discrete components. A component or module can also be implemented in programmable hardware devices such as field programmable gate arrays, programmable array logic, programmable logic devices, or the like. Components or modules can also be implemented in software for execution by various types of processors. An identified component or module of executable code can, for instance, comprise one or more physical or logical blocks of computer instructions, which can, for instance, be organized as an object, procedure, or function. Nevertheless, the executables of an identified component or module need not be physically located together, but can comprise disparate instructions stored in different locations which, when joined logically together, comprise the component or module and achieve the stated purpose for the component or module.

Indeed, a component or module of executable code can be a single instruction, or many instructions, and can even be distributed over several different code segments, among different programs, and across several memory devices. Similarly, operational data can be identified and illustrated herein within components or modules, and can be embodied in any suitable form and organized within any suitable type of data structure. The operational data can be collected as a single data set, or can be distributed over different locations including over different storage devices, and can exist, at least partially, merely as electronic signals on a system or network. The components or modules can be passive or active, including agents operable to perform desired functions.

We claim:

1. A high-speed level translation memory driver apparatus comprising:
   a P-channel metal oxide semiconductor (PMOS) field effect transistor (FET) cross quad,
   two N-channel metal oxide semiconductor (NMOS) FETs with source terminals connected to ground and drain terminals connected to a differential output;
   a pair of differential input terminals connected to gate terminals of the two NMOS FETs; and
   two charge pumps with charge pump inputs connected to the pair of differential input terminals and with charge pump outputs connected to gates of two lower PMOS FETs, the charge pumps comprising: charge pump capacitors configured to store and inject charge onto gate terminals of the two lower PMOS FETs, and charge pump resistors configured to charge and discharge the charge pump capacitors between switching;

wherein the PMOS FET cross quad comprises:
two upper PMOS FETs with source terminals connected to an input/output (I/O) power supply voltage and with gate terminals that are cross connected to the differential output; and
the two lower PMOS FETs with source terminals connected to drain terminals of the upper PMOS FETs and with two drain terminals of the two lower PMOS FETs connected to the differential output.

2. The apparatus of claim 1 further comprising a single-ended to differential conversion circuit operating on a microprocessor core supply voltage wherein an output of the single-ended to differential conversion circuit is connected to the pair of differential input terminals; and
wherein the microprocessor core supply voltage is less than the I/O power supply voltage.

3. A high-speed level translation memory driver comprising:
a P-channel metal oxide semiconductor (PMOS) field effect transistor (FET) cross quad;
two N-channel metal oxide semiconductor (NMOS) FETs with source terminals connected to ground and drain terminals connected to a differential output;
a pair of differential input terminals connected to gate terminals of the two NMOS FETs; and
two charge pumps with charge pump inputs connected to the pair of differential input terminals and with charge pump outputs connected to gates of two lower PMOS FETs;
two upper PMOS FETs with source terminals connected to an input/output (I/O) power supply voltage and with gate terminals that are cross connected to the differential output; and
the two lower PMOS FETs with source terminals connected to drain terminals of the upper PMOS FETs and with two drain terminals of the two lower PMOS FETs connected to the differential output;
two high supply mode transmission gates connected between the charge pumps and gate terminals of the lower PMOS FETs; and
two low supply mode transmission gates connected between the differential input terminals and the gate terminals of the lower PMOS FETs.

4. The apparatus of claim 3 further comprising two auxiliary NMOS transistors with source terminals connected to the differential output and gate terminals cross connected to the differential input terminals.

5. The apparatus of claim 3 further comprising buffers connected between the differential input terminals and the charge pump inputs and buffers connected between the differential input terminals and the gate terminals of the NMOS FETs.

6. The apparatus of claim 3 further comprising control circuitry configured to:
enable the high supply mode transmission gates when the I/O power supply voltage is greater than a memory supply voltage threshold;
disable the low supply mode transmission gates when the I/O power supply voltage is greater than the memory supply voltage threshold;
disable the high supply mode transmission gates when the I/O power supply voltage is less than the memory supply voltage threshold; and
enable the low supply mode transmission gates when the I/O power supply voltage is less than the memory supply voltage threshold.

7. The apparatus of claim 3 wherein the two charge pumps are configured to reduce a switching time of the differential output.

8. A method for driving a memory device operating on an input/output (I/O) supply voltage from a microprocessor operating on a core supply voltage, the method comprising:
driving gate terminals of a pair of N-channel metal oxide semiconductor (NMOS) field effect transistors (FETs) using a differential input signal that switches between a ground voltage to the core supply voltage to switch a differential output;
using positive feedback of a P-channel metal oxide semiconductor (PMOS) cross quad to assist in switching the differential output between the ground voltage and the I/O supply voltage;
injecting charge onto a gate terminal of a first lower PMOS FET inside the PMOS cross quad by using charge pump capacitor;
using a charge pump capacitor to inject or remove the charge onto the gate terminal of the lower PMOS FETs of the PMOS cross quad; and
charging the charge pump capacitor through a resistor connected to the core supply voltage and connected to the differential input terminal through an inverting buffer operating on the core supply voltage.

9. The method of claim 8 wherein:
drain terminals of the pair of NMOS FETs are connected to the differential output;
two source terminals of upper PMOS FET in the PMOS cross quad are connected to an I/O supply voltage; and
two gate terminals of upper PMOS FET in the PMOS cross quad are cross connected to the differential output.

10. The method of claim 8 further comprising removing charge from a gate terminal of a second lower PMOS FET within the PMOS cross quad by using charge pump capacitor.

11. The method of claim 10 wherein the injection of the charge onto the gate terminal of the first lower PMOS FET and the removal of the charge from the gate terminal of the second lower PMOS FET reduce a switching time of the differential output.

12. The method of claim 8 further comprising generating the differential input signal from a single-ended data input signal using logic circuits operating on the core supply voltage.

13. The method of claim 8 further comprising preventing the differential output terminals from transitioning lower than 0 Volts using an auxiliary NMOS FET wherein the source of the auxiliary NMOS FET is connected to the differential output terminal.

14. The method of claim 11 further comprising:
engaging a pair of charge pumps by activating a pair of high supply transmission gates such that the charge pumps inject the charge through the pair of high supply transmission gates;
disengaging the pair of charge pumps by deactivating the pair of high supply transmission gates; and
activating a pair of low supply transmission gates such that the gate terminal of the first PMOS FET and the gate terminal of the second PMOS FET are configured to directly receive the differential input signal.

15. The apparatus of claim 3 further comprising a single-ended to differential conversion circuit operating on a microprocessor core supply voltage wherein an output of the single-ended to differential conversion circuit is connected to the pair of differential input terminals; and wherein the microprocessor core supply voltage is less than the I/O power supply voltage.

16. The apparatus of claim 1 further comprising two auxiliary NMOS transistors with source terminals connected to the differential output and gate terminals cross connected to the differential input terminals.

17. The apparatus of claim 1 further comprising buffers connected between the differential input terminals and the charge pump inputs and buffers connected between the differential input terminals and the gate terminals of the NMOS FETs.

18. The apparatus of claim 1 further comprising control circuitry configured to:
 enable the high supply mode transmission gates when the I/O power supply voltage is greater than a memory supply voltage threshold;
 disable the low supply mode transmission gates when the I/O power supply voltage is greater than the memory supply voltage threshold;
 disable the high supply mode transmission gates when the I/O power supply voltage is less than the memory supply voltage threshold; and
 enable the low supply mode transmission gates when the I/O power supply voltage is less than the memory supply voltage threshold.

19. The apparatus of claim 1 wherein the two charge pumps are configured to reduce the switching time of the differential output.

* * * * *